US 6,515,445 B2

(12) United States Patent
Shoji et al.

(10) Patent No.: US 6,515,445 B2
(45) Date of Patent: Feb. 4, 2003

(54) DIGITAL ENCODER CONTROL METHOD (75) Inventors: Michiharu Shoji, Kanagawa (JP);
Nobutsune Kobayashi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/905,876

(22) Filed: Jul. 17, 2001

(65) Prior Publication Data

US 2002/0021232 A1 Feb. 21, 2002

(30) Foreign Application Priority Data

Jul. 19, 2000 (JP) .......................... 2000-218488

(51) Int. Cl.[7] ................................. H02P 8/00
(52) U.S. Cl. ...................... 318/696; 318/685; 318/640; 318/313; 318/254; 347/42; 347/57; 347/10; 347/11; 347/14; 341/50
(58) Field of Search ..................... 341/50; 318/685, 318/696, 640, 313, 254; 347/42, 57, 14, 10, 11

(56) References Cited

U.S. PATENT DOCUMENTS

| 4,158,800 A | * | 6/1979 | Jahelka et al. | .............. 318/640 |
| 5,630,029 A | * | 5/1997 | Kosukegawa | .............. 358/1.14 |
| 5,744,929 A | * | 4/1998 | Miyazaki | .............. 318/685 |
| 6,111,384 A | * | 8/2000 | Stagnitto | .............. 318/602 |
| 6,170,933 B1 | * | 1/2001 | Nitta et al. | .............. 347/42 |
| 6,184,646 B1 | * | 2/2001 | Yagoshi et al. | .............. 318/696 |
| 6,302,514 B1 | * | 10/2001 | Eade et al. | .............. 347/14 |
| 6,354,690 B1 | * | 3/2002 | Murakami | .............. 347/14 |

FOREIGN PATENT DOCUMENTS

| EP | 0 343 352 | 11/1989 |
| EP | 0 706 896 | 4/1996 |
| JP | 63-198814 | 8/1988 |
| WO | WO 99/66335 | 12/1999 |

OTHER PUBLICATIONS

J. Rull et al., "Programmable Logic Design for an Encoder–based Velocity Sensor in a DSP–Controlled Motion System," Emerging Technologies and Factory Automation, 1999 Proceedings, ETFA '99, 1999 7th IEEE International Conference on Barcelona, Spain, Oct. 18–21, 1999, pp. 1243–1247.

* cited by examiner

Primary Examiner—Michael Tokar
Assistant Examiner—Linh Van Nguyen
(74) Attorney, Agent, or Firm—Fitzpatrick, Cella, Harper & Scinto (57) ABSTRACT A digital encoder control method of a digital control apparatus has a driving unit, a frequency signal generating unit for generating a pulse signal of a frequency according to a driving velocity of a driven member which is driven by the driving unit, an edge detecting unit for detecting a rising-up edge and a falling-down edge of the pulse signal, and a period data detecting unit for counting period data between edges detected by the edge detecting unit. Each time the edges are detected by the edge detecting unit, the period data between the same edges as the detected edges is outputted as control velocity data of the driving unit.

2 Claims, 7 Drawing Sheets

DIGITAL ENCODER CONTROL METHOD

BACKGROUND OF THE INVENTION

1. Field of the Invention

The invention relates to a method of updating velocity data in case of performing a servo control on the basis of a digital encoder signal. More particularly, the invention relates to a digital encoder control method suitable for applying to a positioning servo for controlling a feed position by a paper feed control of a recording apparatus.

2. Related Background Art

An ink jet recording apparatus is widely used as a means which is installed into a printer, a facsimile, or a copying apparatus and records an image (including characters and symbols) onto a recording medium such as paper, plastic thin sheet (OHP or the like), or the like on the basis of image data.

The ink jet recording apparatus performs the recording by emitting an ink droplet from a recording head onto the recording medium and has features such that a compact size of recording means can be easily realized, an image of a high precision can be recorded at a high speed, running costs are low, and noises are small since it is a non-impact type. The ink jet recording apparatus also has an advantage such that a color image can be easily recorded by using inks of multicolors.

As driving sources of the ink jet recording apparatus, there are a carriage motor for reciprocatively driving a carriage on which the recording head is mounted, an ASF motor for feeding the recording medium, a recovery system motor for performing a head cleaning or the like, a paper feed motor for feeding the recording medium every recording scan, and the like. Hitherto, a stepping motor has often been used as such a driving source because low costs can be easily realized, a control is simple, and the like.

The noise level of the ink jet recording apparatus is low because it is a non-impact type. However, the usage of a DC motor as such a driving source is increasing for the purpose of realizing a further silent operation or the like. In this case, an encoder is generally used for obtaining control data of the DC motor.

Figure 6:
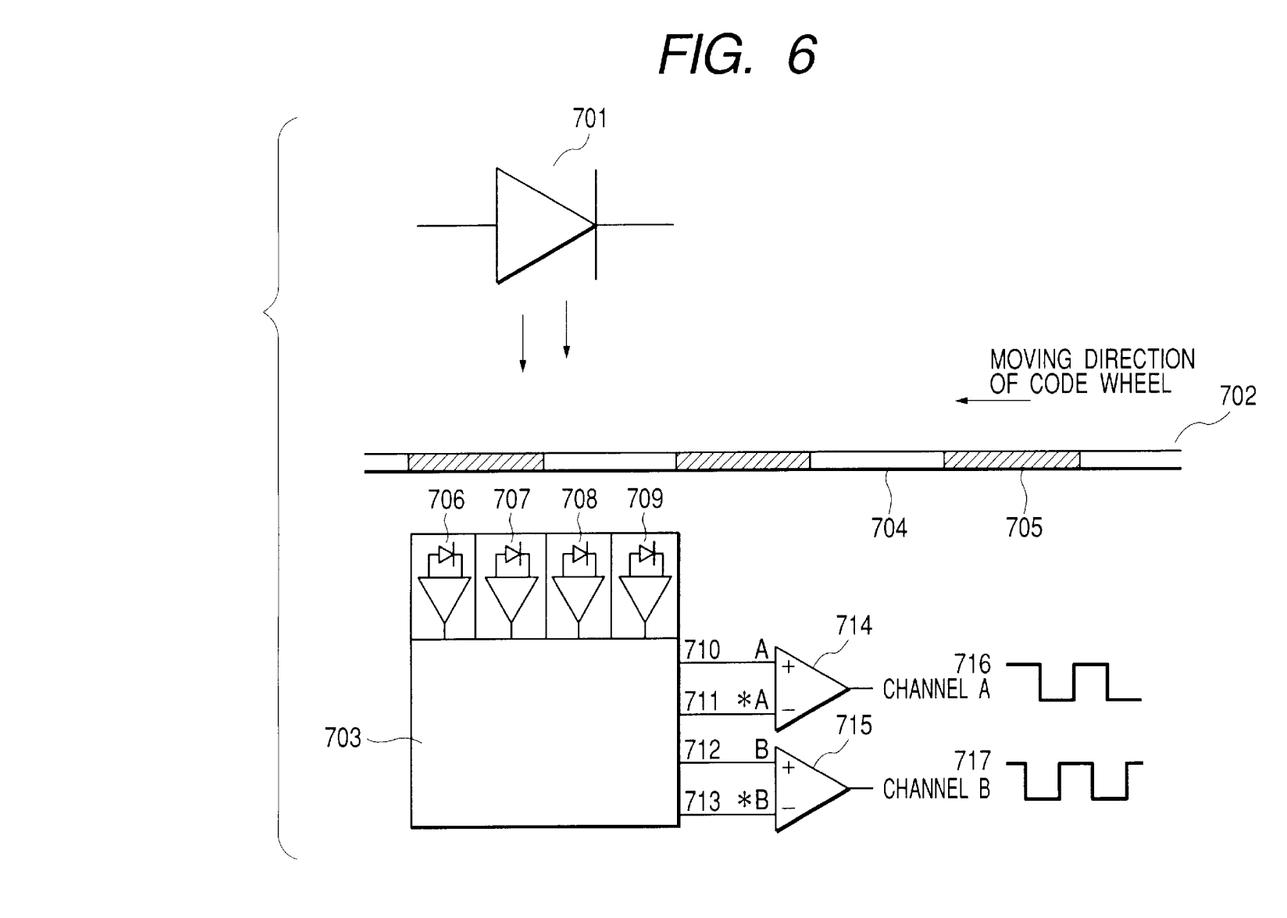
FIG. 6 is a model diagram of a digital encoder.

FIG. 6 shows a model diagram of the encoder. According to the encoder, a detector 703 detects light emitted from an LED 701 through a code wheel 702 and generates a signal. Light transmitting portions 704 and light non-transmitting portions 705 are arranged on the code wheel 702 at predetermined intervals. Photodiodes 706, 707, 708, and 709 are arranged in the detector 703 at predetermined intervals. The light detected by the photodiodes 706, 707, 708, and 709 is converted into an electric signal A 710, an electric signal *A 711, an electric signal B 712, and an electric signal *B 713, which are output. The outputted electric signals 710, 711, 712, and 713 are outputted as differential outputs, Channel A 716 and Channel B 717, by comparators 714 and 715, respectively.

Figure 7:
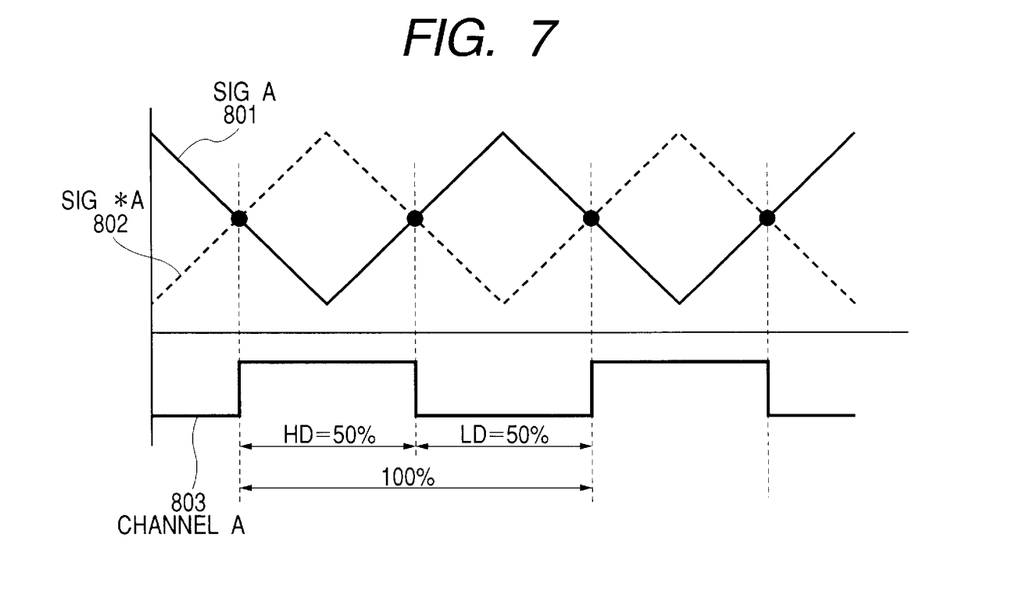
FIG. 7 is a diagram of waveforms of encoder differential outputs.

FIG. 7 shows waveforms of the differential output signals. A signal which is inverted at a cross point of an electric signal A 801 and an electric signal *A 802 becomes a Channel A 803. When a velocity is constant, a duty ratio of the Channel A 803 is ideally equal to 50%. However, the duty ratio changes due to various factors. An important one of the factors is a sensitivity difference of the photodiodes.

Figure 8:
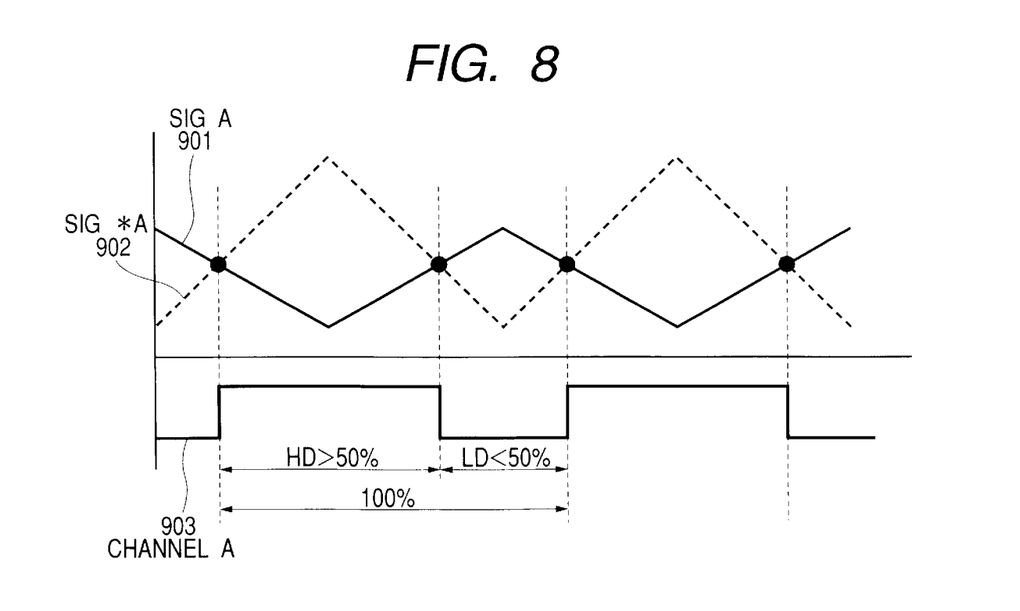
FIG. 8 is a diagram of waveforms of encoder differential outputs in the case where there is a sensitivity difference between photodiodes.

FIG. 8 shows waveforms of the differential output signals in the case where there is a difference between the sensitivities of the photodiodes. The sensitivity of the photodiode appears as an amplitude difference of the electric signals. FIG. 8 shows a Channel A 903 in the case where an amplitude of an electric signal A 901 is smaller than that of an electric signal *A 902. It will be understood from FIG. 8 that the sensitivity difference of the photodiodes changes a duty ratio of an output signal. However, it does not exert an influence on a period of the Channel A. Because of the reasons as mentioned above, generally, the period of the output signal of the encoder has the highest precision.

Position data and velocity data are obtained as control data of the DC motor from the encoder signal. To obtain more accurate data as velocity data, generally, a one-edge sampling system for counting and employing, for example, a period in a range from a rising-up edge to another rising-up edge of an output signal is used.

However, when the velocity data is obtained by the one-edge sampling system, the velocity data is not updated unless the output signal of the encoder elapses one period. That is, the number of times of update of the velocity data is only ½ as compared to that of a both-edge sampling system and is only ¼ as compared to that in case of sampling both edges of two phases, i.e. the Channel A and the Channel B.

For example, when considering a paper feed control of the ink jet recording apparatus, the paper is fed at a high speed at the beginning and a servo control is performed at a low speed from a position that is slightly before a stop position. After that, the control mode is shifted to a stop mode at a position just before a target stop position, thereby stopping the paper at the target position. In this case, the operation for stabilizing the low-speed servo control at the position which is slightly before the stop position, largely influences on a stop precision of the paper.

As mentioned above, when the paper is fed at a low speed, a change in encoder signal naturally becomes slow and an updating interval of the velocity data in the one-edge sampling system also becomes long. Therefore, a case where the velocity data obtained at a servo period is not updated from previously obtained velocity data occurs, and thus a problem such that the servo operation is not stable occurs.

If the both-edge sampling system or the like is used in order to solve the above problem, although the updating interval of the velocity data becomes short, the precision of the velocity data deteriorates due to the above-mentioned reasons, and thus a problem such that the servo operation is not stable similarly occurs.

SUMMARY OF THE INVENTION

It is an object of the invention to provide a digital encoder control method which can realize the stable servo operation of a short velocity data updating interval at a precision that is equal to that of a conventional one-edge sampling system.

Another object of the invention to provide a digital encoder control method comprising the steps of: arranging driving means; arranging frequency signal generating means for generating a pulse signal of a frequency according to a driving velocity of a driven member which is driven by the driving means; arranging edge detecting means for detecting a rising-up edge and a falling-down edge of the pulse signal; and arranging period data detecting means for counting period data indicative of a period between the edges detected by the edge detecting means, wherein each time the edges are detected by the edge detecting means, the period data of the period between the same edges as the detected edges is outputted as control velocity data of the driving means.

DETAILED DESCRIPTION OF THE PREFERRED EMBODIMENTS

First Embodiment

A preferred embodiment of the invention will now be described in detail hereinbelow with reference to the drawings. An example of a serial type ink jet printer in which a recording head having a detachable ink tank has been mounted will be described here.

Figure 1:
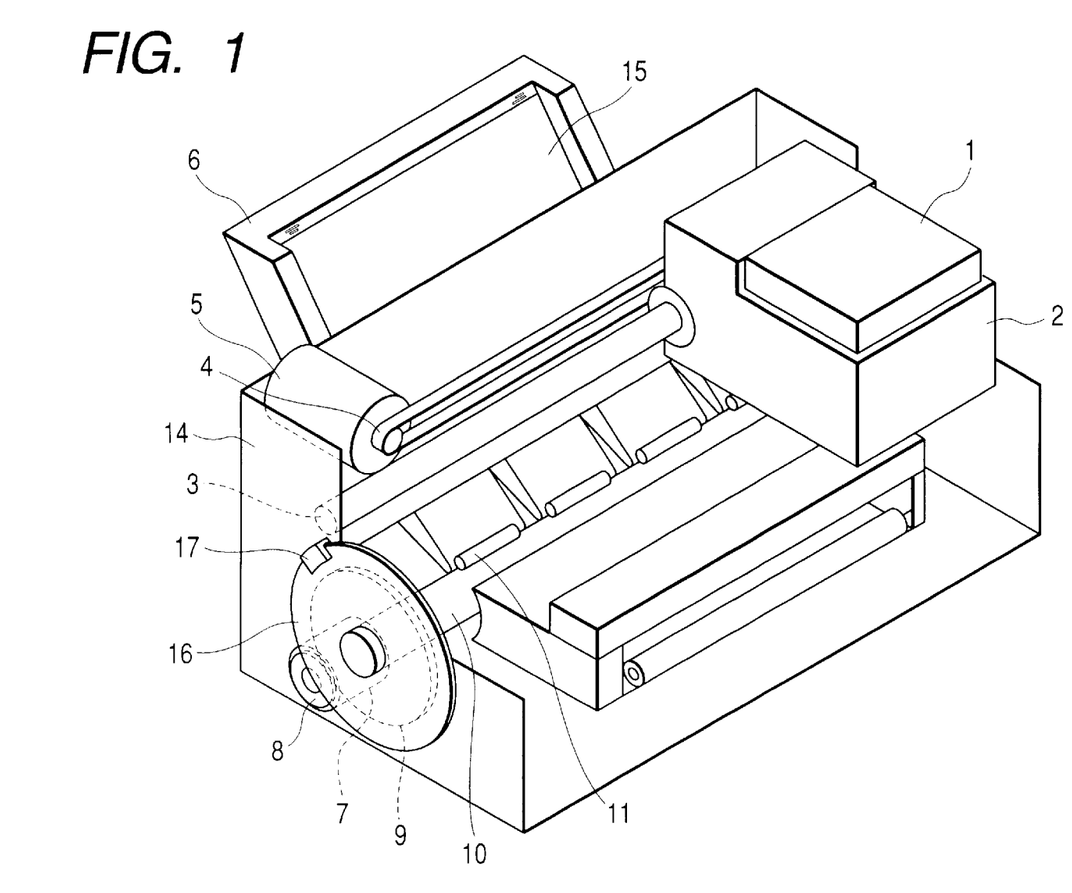
FIG. 1 is a whole perspective view showing a schematic structure of a serial type ink jet printer as an embodiment of the invention.

FIG. 1 is a whole perspective view showing a schematic structure of the serial type ink jet printer in the first embodiment of the invention. In the diagram, reference numeral 1 denotes a recording head having an ink tank and 2 indicates a carriage on which the recording head 1 is mounted.

A guide shaft 3 is inserted into a bearing portion of the carriage 2 in a state where it is slidable in the main scanning direction. Both edges of the shaft 3 are fixed to a chassis 14. A driving force of a driving motor 5 is transferred to the carriage 2 through a belt 4 as carriage drive transfer means which is in engagement with the carriage 2, so that the carriage 2 moves in the main scanning direction.

In a recording standby mode, recording papers 15 are stacked onto a paper feed base 6. At the start of the recording, the recording papers are fed one by one by a paper feed roller (not shown). To convey the fed recording paper, a conveying roller 10 is rotated by a driving force of a conveying motor 7 as a DC motor through a gear train (motor gear 8, conveying roller gear 9) as transfer means. The recording paper 15 is conveyed only by a proper feed amount by the conveying roller 10 and pinch rollers 11 which are rotated with being pressed onto the conveying roller 10 by a pinch roller spring (not shown).

Slits of a code wheel (rotary encoder film 16) inserted into the conveying roller gear 9 with a pressure are detected and counted by an encoder sensor 17, whereby a conveying amount is managed, and thus a feed amount may be controlled at a high precision.

Figure 2:
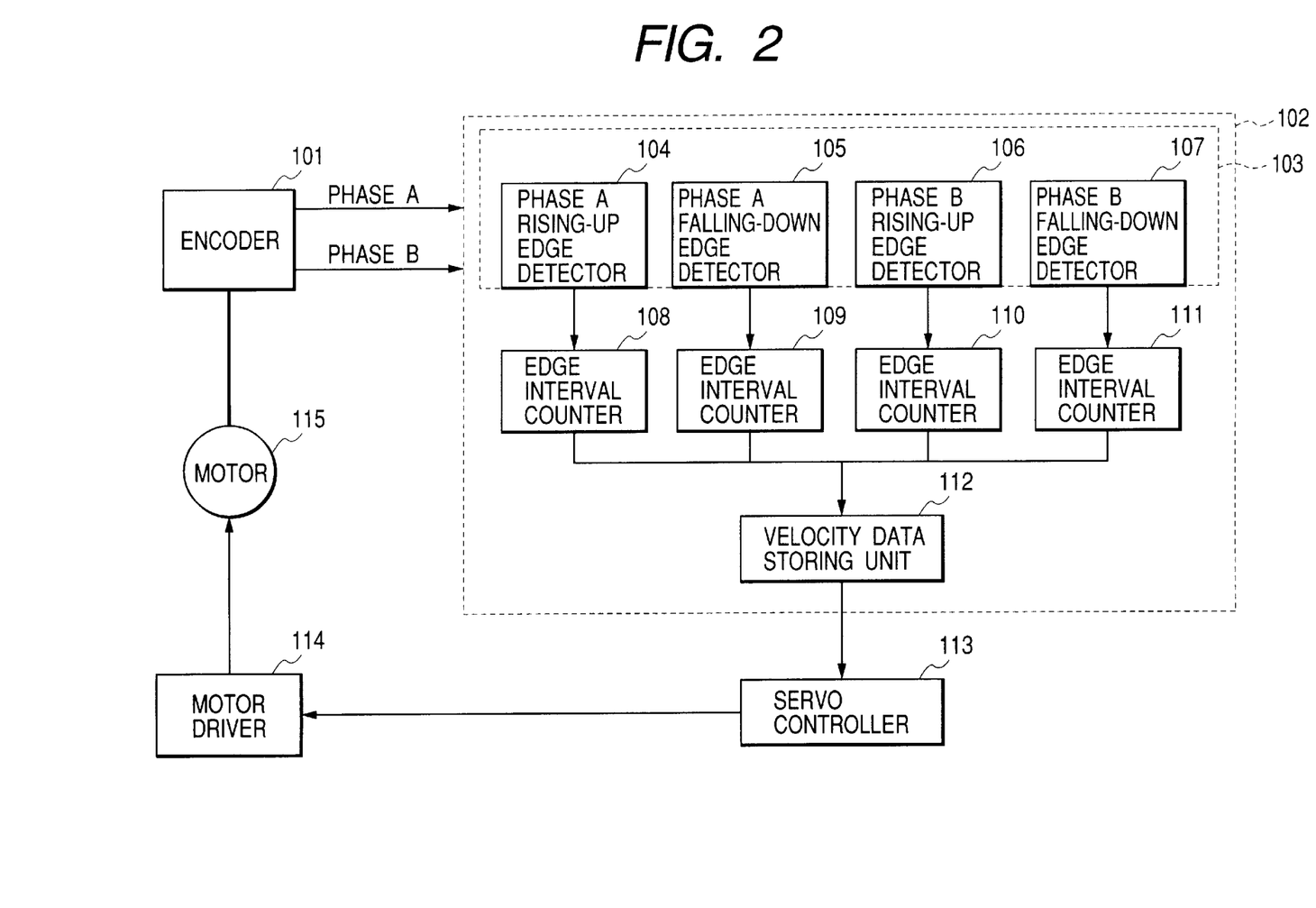
FIG. 2 is a block diagram for explaining the first embodiment of the invention.

FIG. 2 shows a block diagram for explaining the first embodiment of the invention. In FIG. 2, by the driving of a motor 115, an encoder 101 outputs two signals of phase A and phase B to an encoder signal control unit 102. An edge detecting unit 103 for detecting edges of the encoder signals is provided in the encoder signal control unit 102. In the edge detecting unit 103, each edge of each phase is detected, that is, a rising-up edge detection 104 of phase A, a falling-down edge detection 105 of phase A, a rising-up edge detection 106 of phase B, and a falling-down edge detection 107 of phase B are independently performed, so that a signal synchronized with each edge is generated.

The signals synchronized with the respective edges are sent to edge interval counters 108, 109, 110, and 111, respectively. Each edge interval is independently counted. The edge detection signals are sent from the edge detecting unit 103 to the edge interval counters 108, 109, 110, and 111 and each time the edge interval is determined, the velocity data in a velocity data storing unit 112 is overwritten. When a servo period of a predetermined interval comes, a servo controller 113 reads (Read) the velocity data storing unit 112 in order to obtain the velocity data necessary for the servo control. On the basis of the obtained velocity data, position data, and the like, the servo controller 113 executes an arithmetic operation and outputs optimum motor control data to a motor driver 114. The motor driver 114 outputs a driving signal to the motor 115 in accordance with the inputted control data, thereby driving the motor 115.

Figure 3:
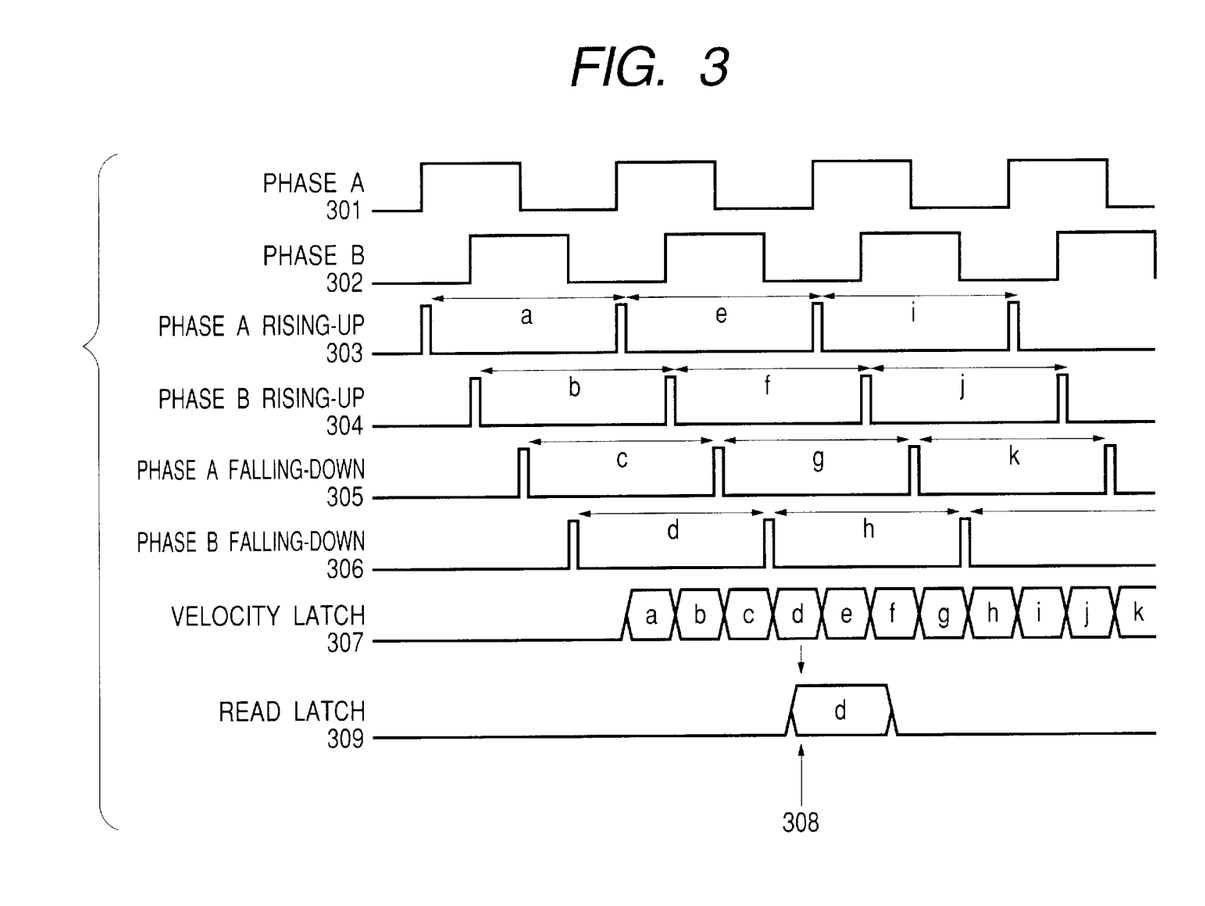
FIG. 3 is a timing chart for explaining the first embodiment of the invention.

FIG. 3 shows a timing chart for explaining the first embodiment of the invention. With respect to phase A 301 and phase B 302 of the encoder signal, the following edge detection signals are generated: that is, a phase A rising-up edge detection signal 303 synchronized with a rising-up edge of phase A 301; a phase B rising-up edge detection signal 304 synchronized with a rising-up edge of phase B 302; a phase A falling-down edge detection signal 305 synchronized with a falling-down edge of phase A 301; and a phase B falling-down edge detection signal 306 synchronized with a falling-down edge of phase B 302, respectively. An interval of each edge signal is independently counted by each counter (not shown).

If a rising-up edge interval (a) of phase A is determined due to the generation of the phase A rising-up edge detection signal 303, the counter (not shown) which counts the phase A rising-up edge interval is reset and the determined phase A rising-up edge interval (a) is latched into a velocity data latch 307. Subsequently, if a rising-up edge interval (b) of phase B is determined due to the generation of the phase B rising-up edge detection signal 304, the counter (not shown) which counts the phase B rising-up edge interval is reset and the determined phase B rising-up edge interval (b) is overwritten into the velocity data latch 307. After that, if the phase A falling-down edge detection signal 305 is generated, the counter (not shown) which counts a phase A falling-down edge interval is reset, a falling-down edge interval (c) of phase A is overwritten into the velocity data latch 307. If the phase B falling-down edge detection signal 306 is generated, the counter (not shown) which counts a phase B falling-down edge interval is reset, and a falling-down edge interval (d) of phase B is overwritten into the velocity data latch 307. If the phase A rising-up edge detection signal 303 is generated again, the counter (not shown) which counts the phase A rising-up edge interval is reset, and a determined rising-up edge interval (e) of phase A is latched into the velocity data latch 307. The operation similar to that mentioned above is repeated after that.

When the servo controller requests the reading of the velocity data at a timing of a servo period 308, velocity data (d) in the velocity data latch 307 is latched into a Read Latch 309. The servo controller reads the velocity data in the Read Latch 309.

As will be obviously understood from FIG. 3, according to the invention, the velocity data is updated four times for one period of time of the encoder and the velocity data certainly becomes the count data between the same edges. Thus, even if the servo control is performed at a low speed, the stable servo control can be performed.

Second Embodiment

Figure 4:
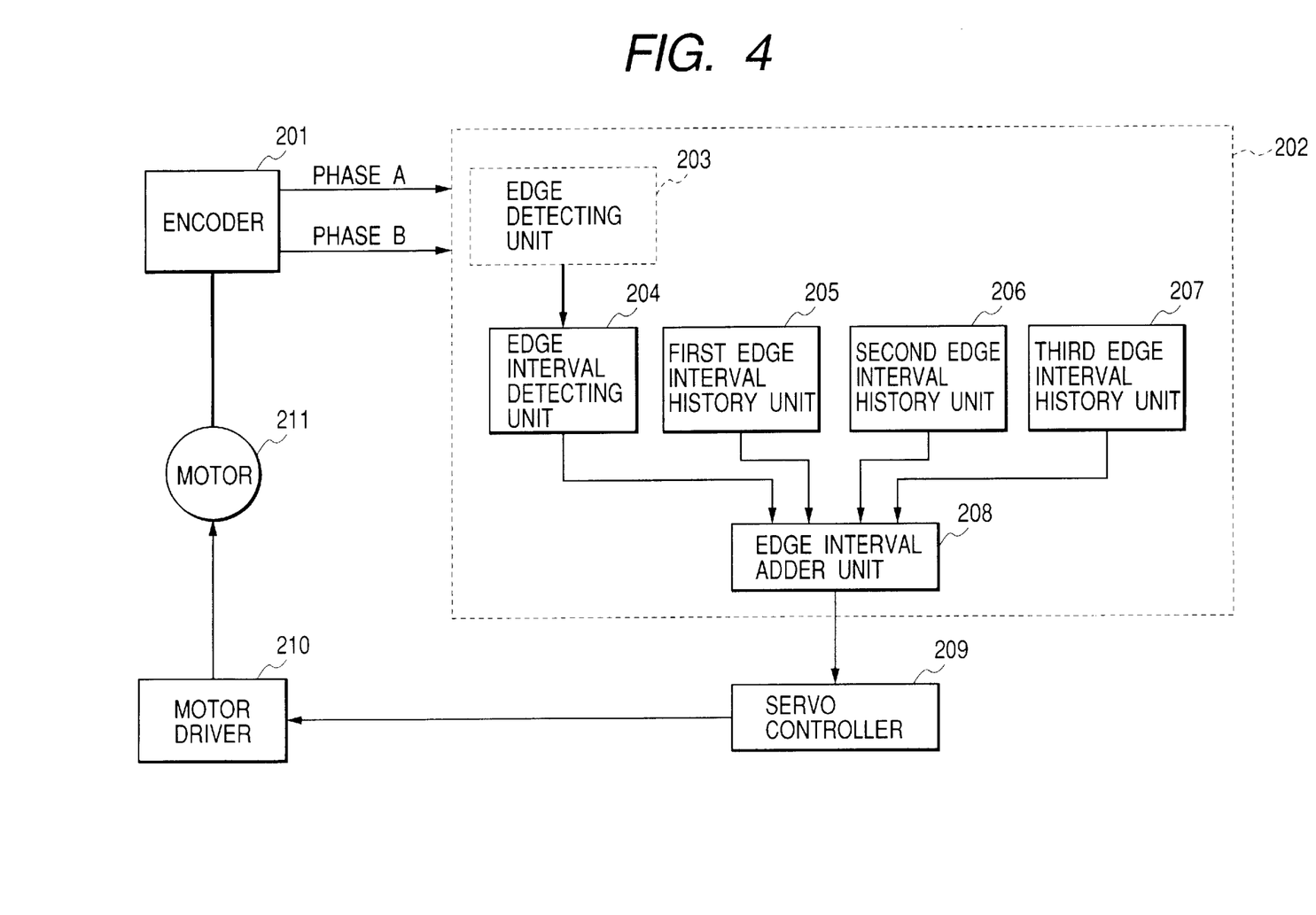
FIG. 4 is a block diagram for explaining the second embodiment of the invention.

FIG. 4 shows a block diagram for explaining the second embodiment of the invention. By the driving of a motor 211, an encoder 201 outputs two signals of phase A and phase B to an encoder signal control unit 202. An edge detecting unit 203 for detecting edges of the encoder signal is provided in the encoder signal control unit 202. The edge detecting unit 203 generates a signal synchronized with each edge each time each edge of each phase is detected, that is, each time a rising-up edge and a falling-down edge of phase A and a rising-up edge and a falling-down edge of phase B are detected. The signals synchronized with the edges are sent to an edge interval detecting unit 204 and edge intervals are counted.

When the edge detection signals are outputted from the edge detecting unit 203 and the edge interval is determined, the velocity data latched so far in the edge interval detecting unit 204 is latched into a first edge interval history unit 205. Similarly, the velocity data latched in the first edge interval history unit 205 is latched into a second edge interval history unit 206. The velocity data latched in the second edge interval history unit 206 is latched into a third edge interval history unit 207.

Each velocity data latched in the edge interval detecting unit 204, first edge interval history unit 205, second edge interval history unit 206, and third edge interval history unit 207 is sent to an edge interval adder unit 208. A result of addition of four velocity data is stored as velocity data at that time. That is, in the edge interval adder unit 208, the velocity data is updated each time the edge detection signals are outputted from the edge detecting unit 203.

A servo controller 209 reads the velocity data in the edge interval adder unit 208 when the servo period of a predetermined interval comes. On the basis of the obtained velocity data, position data, and the like, the servo controller 209 executes an arithmetic operation and outputs the optimum motor control data to a motor driver 210. The motor driver 210 outputs a driving signal to the motor 211 in accordance with the inputted control data, thereby driving the motor 211.

Although the addition of the velocity data is executed in the encoder signal control unit 202, the servo controller 209 can also read the velocity data latched in each of the edge interval detecting unit 204, first edge interval history unit 205, second edge interval history unit 206, and third edge interval history unit 207 and add them in a software manner.

Figure 5:
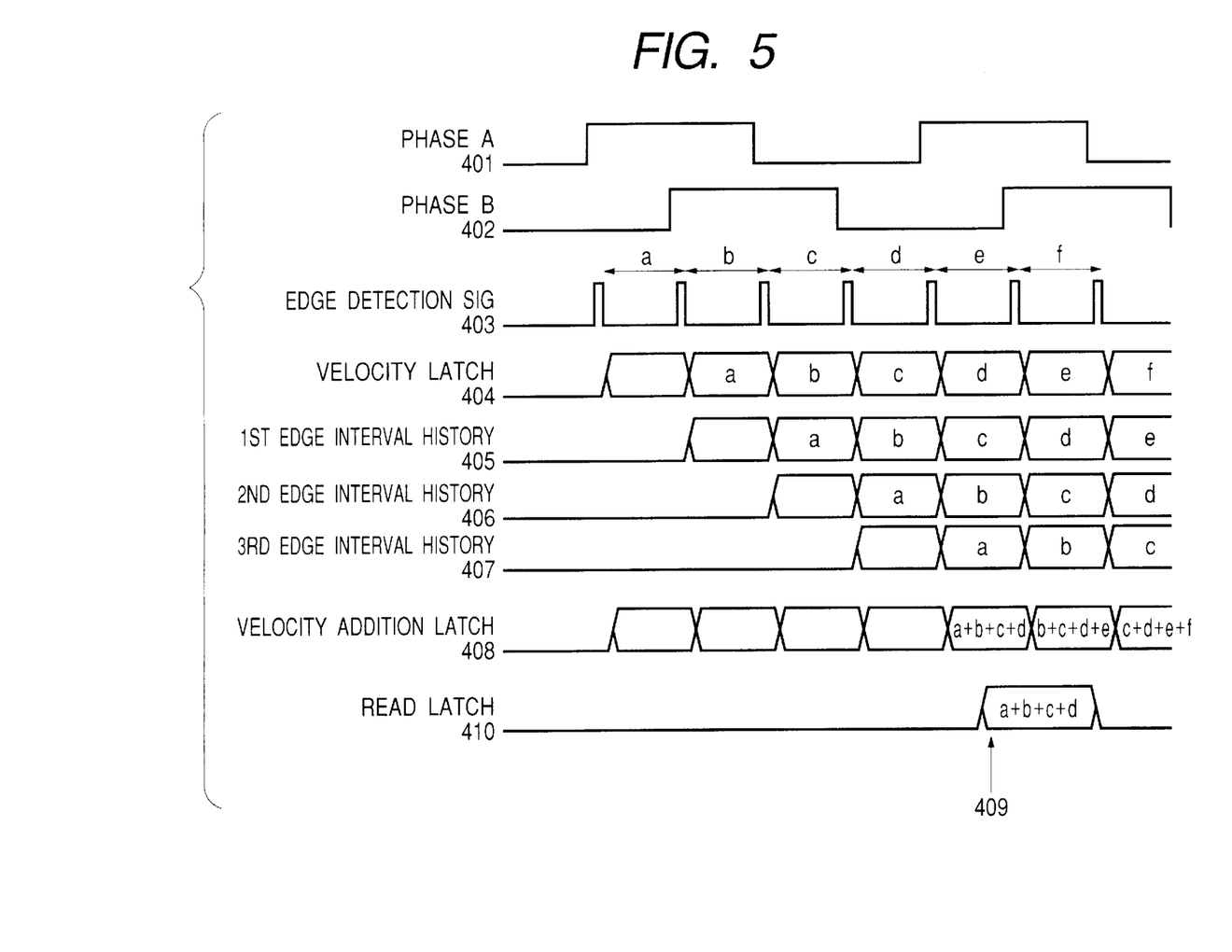
FIG. 5 is a timing chart for explaining the second embodiment of the invention.

FIG. 5 shows a timing chart for explaining the second embodiment of the invention. With respect to phase A 401 and phase B 402 of the encoder signal, each time each edge of each phase is detected, an edge detection signal 403 synchronized with each edge is generated. Intervals between the edge signals are counted by a counter (not shown). When the edge interval (a) is determined due to the generation of the edge detection signal 403, the counter (not shown) which counts the edge intervals is reset and the determined edge interval (a) is latched into a velocity data latch 404. When the edge detection signal 403 is generated again and the edge interval (b) is determined, the counter which counts the edge intervals is reset and the determined edge interval (b) is overwritten into the velocity data latch 404. The velocity data (a) is shifted to a first edge interval history 405.

After that, when the edge detection signal 403 is generated again, the counter is reset. The edge interval (c) is latched into the velocity data latch 404, the velocity data (b) is latched into the first edge interval history 405, and the velocity data (a) is latched into a second edge interval history 406, respectively. When the edge detection signal 403 is further generated, the counter is reset. The edge interval (d) is latched into the velocity data latch 404, the velocity data (c) is latched into the first edge interval history 405, the velocity data (b) is latched into the second edge interval history 406, and the velocity data (a) is latched into a third edge interval history 407, respectively.

In a manner similar to that mentioned above, each time the edge detection signal 403 is generated, the latching operation is repeated. Each time the edge detection signal 403 is generated, a result of an addition of values in the velocity data latch 404, first edge interval history 405, second edge interval history 406, and third edge interval history 407 is stored into a velocity addition latch 408.

When the servo controller requests the reading of the velocity data at the timing of a servo period 409, the data in the velocity addition latch 408 is latched into a Read Latch 410. The servo controller reads the velocity data in the Read Latch 410.

As will be obviously understood from FIG. 5, according to the invention, the velocity data is updated four times for one period of time of the encoder. The velocity data certainly becomes count data between the same edges. Thus, even if the servo control is executed at a low speed, the stable servo control can be performed.

As described above, according to the embodiment, when the velocity data is obtained from the output signal from the digital encoder, the velocity data updating interval is set to a short interval which is ½ or ¼ as large as that of the one-edge sampling system at a precision that is equivalent to that obtained in case of the one-edge sampling system. Particularly, the servo operation in case of performing the servo control at a low speed can be stabilized.

What is claimed is:

1. A digital encoder control method comprising the steps of:

arranging driving means;

arranging first frequency signal generating means for generating a first pulse signal of a frequency according to velocity data of a driven member which is driven by said driving means;

arranging second frequency signal generating means for generating a second pulse signal having a phase deviated by about 90° as an electric angle from said first pulse signal;

arranging edge detecting means for detecting a rising-up edge and a falling-down edge of said first pulse signal and a rising-up edge and a falling-down edge of said second pulse signal;

arranging period data detecting means for counting a period between the edges detected by said edge detecting means;

arranging first period history data storing means for storing a one-preceding history of period data of said period counted by said period data detecting means;

arranging second period history data storing means for storing a two-preceding history of period data of said period counted by said period data detecting means;

arranging third period history data storing means for storing a three-preceding history of period data of said period counted by said period data detecting means;

arranging adding means for adding said period data, said one-preceding history, said two-preceding history, and said three-preceding history of period data of said period counted by said period data detecting means; and updating period data obtained by said adding means as control velocity data of said driving means each time said edge detecting means detects the edges.

2. A recording apparatus which performs recording on a recording medium by using a recording head, said apparatus comprising:

a conveying roller for conveying a recording medium;

a driving motor for driving said conveying roller;

first frequency signal generating means for generating a first pulse signal of a frequency according to velocity data of said conveying roller;

second frequency signal generating means for generating a second pulse signal having a phase deviated by about 90° as an electric angle from said first pulse signal;

edge detecting means for detecting a rising-up edge and a falling-down edge of said first pulse signal and a rising-up edge and a falling-down edge of said second pulse signal;

period data detecting means for counting a period between the edges detected by said edge detecting means;

first period history data storing means for storing a one-preceding history of period data of said period counted by said period data detecting means;

second period history data storing means for storing a two-preceding history of period data of said period counted by said period data detecting means;

third period history data storing means for storing a three-preceding history of period data of said period counted by said period data detecting means; and adding means for adding said period data, said one-preceding history, said two-preceding history, and said three-preceding history of period data of said period counted by said period data detecting means, wherein period data obtained by said adding means is updated as control velocity data of said driving means each time said edge detecting means detects the edges.

* * * * *